(12) United States Patent
De Haan

(10) Patent No.: US 7,679,676 B2
(45) Date of Patent: Mar. 16, 2010

(54) SPATIAL SIGNAL CONVERSION

(75) Inventor: Gerard De Haan, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 510 days.

(21) Appl. No.: 10/560,006

(22) PCT Filed: Jun. 3, 2004

(86) PCT No.: PCT/IB2004/050831

§ 371 (c)(1),
(2), (4) Date: Dec. 8, 2005

(87) PCT Pub. No.: WO2004/112393

PCT Pub. Date: Dec. 23, 2004

(65) Prior Publication Data

US 2007/0116383 A1    May 24, 2007

(51) Int. Cl.
H04N 11/02    (2006.01)

(52) U.S. Cl. .............. 348/453; 348/441; 348/444; 348/581

(58) Field of Classification Search .......... 348/441, 348/444–445, 448, 450, 453, 458–459, 708, 348/581–582, 607; 382/261, 266
See application file for complete search history.

(56) References Cited

U.S. PATENT DOCUMENTS

| 5,684,544 A * | 11/1997 | Astle ...................... 348/708 |
| 6,108,047 A * | 8/2000 | Chen ...................... 348/581 |
| 6,323,905 B1 * | 11/2001 | Kondo et al. ............ 348/441 |
| 7,064,792 B2 * | 6/2006 | Yang et al. ............... 348/445 |
| 7,409,372 B2 * | 8/2008 | Staelin et al. ............. 706/15 |

OTHER PUBLICATIONS

M. Zhao et al "Towards an Overview of Spatial Up-Conversion Techniques", Proceedings of ISCE, Sep. 24, 2002, pp. 23-26, XP008027127.

* cited by examiner

Primary Examiner—Trang U Tran

(57) ABSTRACT

A spatial filter unit (200) for converting a first input signal (U) comprising input samples, into an output signal comprising output samples, is disclosed. The spatial filter unit (200) comprises: a coefficient-determining means (106) for determining a first filter coefficient; and an adaptive filtering means (104) for computing a first one of the output samples on basis of a first one of the input samples and the first filter coefficient. The coefficient-determining means (106) are arranged to determine the first filter coefficient on basis of a second input signal (Y) being correlated to the first input signal (U).

15 Claims, 8 Drawing Sheets

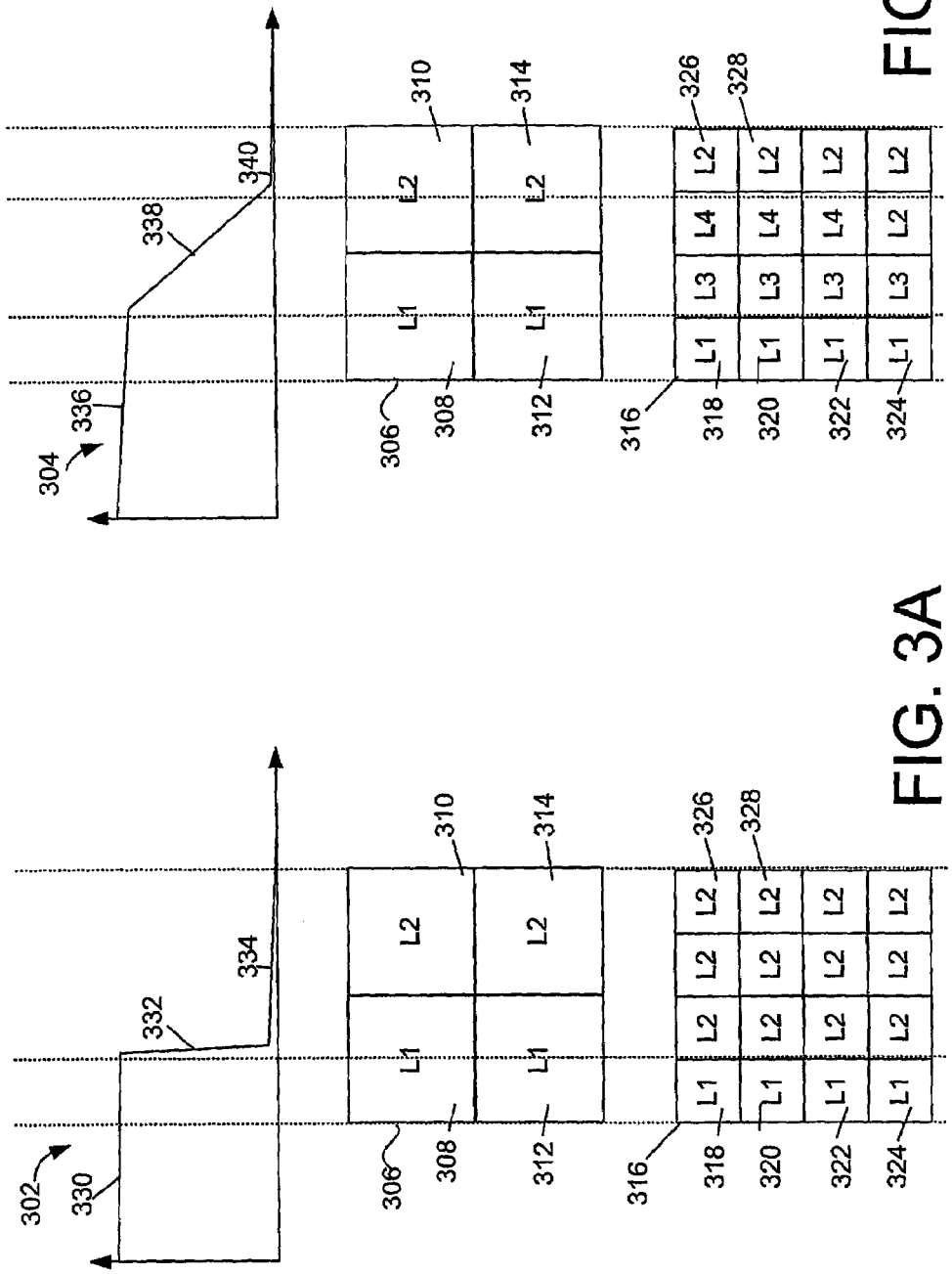

SPATIAL SIGNAL CONVERSION

Figure 1A:
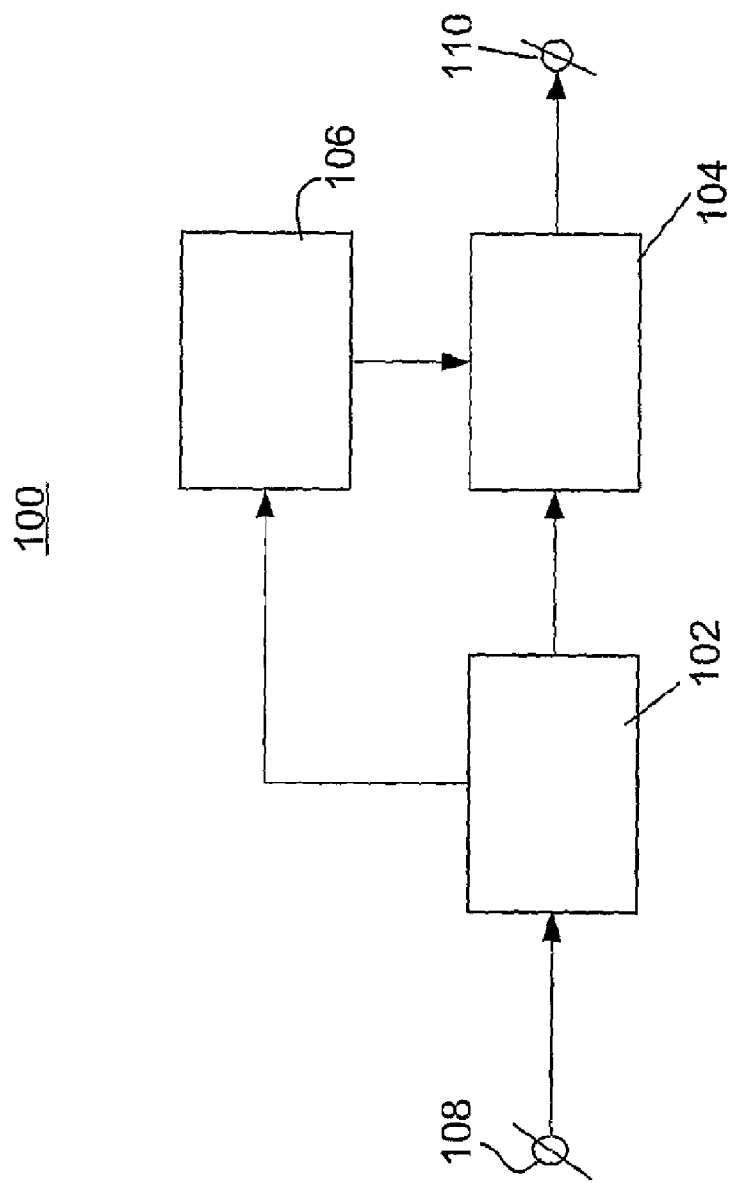

The invention relates to a spatial filter unit for converting an input signal comprising input samples, into an output signal comprising output samples, the spatial filter unit comprising:
- a coefficient-determining means for determining a first filter coefficient; and
- an adaptive filtering means for computing a first one of the output samples on basis of a first one of the input samples and the first filter coefficient.

The invention further relates to an image processing apparatus comprising:
- receiving means for receiving an input signal and a further input signal; and
- a spatial filter unit as described above for converting the input signal into an output signal.

The invention further relates a method of converting an input signal comprising input samples, into an output signal comprising output samples, the method comprising:
- determining a first filter coefficient; and
- computing a first one of the output samples on basis of a first one of the input samples and the first filter coefficient.

The invention further relates a computer program product to be loaded by a computer arrangement, comprising instructions to convert an input signal comprising input samples, into an output signal comprising output samples, the computer arrangement comprising processing means and a memory, the computer program product, after being loaded, providing said processing means with the capability to carry out:
- determining a first filter coefficient; and
- computing a first one of the output samples on basis of a first one of the input samples and the first filter coefficient.

The advent of HDTV emphasizes the need for spatial up-conversion techniques that enable standard definition (SD) video material to be viewed on high definition (HD) television (TV) displays. Conventional techniques are linear interpolation methods such as bi-linear interpolation and methods using poly-phase low-pass interpolation filters. The former is not popular in television applications because of its low quality, but the latter is available in commercially available ICs. With the linear methods, the number of pixels in the frame is increased, but the perceived sharpness of the image is not increased. In other words, the capability of the display is not fully exploited.

Additional to the conventional linear techniques, a number of non-linear algorithms have been proposed to achieve this up-conversion. Sometimes these techniques are referred to as content-based, content adaptive or edge dependent spatial up-conversion. A number of these up-conversion techniques have been described in an overview article "Towards an overview of spatial up-conversion techniques", by Meng Zhao et al., in the proceedings of the ISCE 2002, Erfurt, Germany, 23-26 Sep. 2002. Content-adaptive image up scaling as described in these documents, has proven to give a greatly improved sharpness impression compared to linear up-conversion methods based on the sampling theorem.

A kind of content-based up-conversion is a classification based up-conversion. The main idea of classification based video up-conversion is to adapt the computation of pixels in the HD image on basis of the SD image content. Only image blocks with similar characteristics will be up-scaled with the same spatial filter characteristics, i.e. filter coefficients. The momentary filter coefficients, during interpolation, depend on the local content, i.e. the values of samples of the input signal which represents the input SD image. In the case of video conversion these samples might be the values of pixels within a block of the image. The local content is classified into classes based on the value pattern of the block. To obtain the filter coefficients, a learning process is performed in advance. The learning process employs both HD-video and SD video, which is computed by down-scaling the HD video, as the training material and uses a LMS (Least Mean Square) algorithm to determine the optimal filter coefficients. The training process is computational intensive due to the large number of classes. Fortunately it needs to be performed only once. Preferably the classification of blocks of pixels is realized by using ADRC (Adaptive Dynamic Range Coding), which for 1-bit per pixel encoding reduces to:

$$Q_Y = \begin{cases} 0 : F_{SD} < F_{AV} \\ 1 : F_{SD} \geq F_{AV} \end{cases} \quad (1)$$

Here $F_{SD}$ is the luminance value of the SD pixel and $F_{AV}$ is the average luminance value of the pixels in the current aperture of the filter coefficient-determining means. $Q_Y$ is the encoding result of ADRC. A reason to use ADRC is its simple implementation. Using Equation 1 the number of classes decreases from $8^{12}$ to $2^{12}$ with an aperture containing 12 pixels if there are 256 different possible luminance values. Concatenating the Q-values of the individual pixels in the aperture leads to a class-code, which can be used as an entry of a Look-Up-Table from which the filter coefficients are generated. Other classification techniques can be thought of.

Although the content-based conversion methods perform relatively well, there are still opportunities for improvement.

It is an object of the invention to provide a spatial filter unit of the kind described in the opening paragraph which performs better.

This object of the invention is achieved in that the coefficient-determining means are arranged to determine the first filter coefficient on basis of a further input signal being correlated to the input signal. With correlated is meant that the signals e.g. originate from the same source, are captured simultaneously, correspond to the same object or scene, or that one of the signals is derived from the other. Preferably the coefficient-determining means are arranged to determine the first filter coefficient on basis of both the further input sample and on the input signal. Although the content-based spatial filter unit of the prior art perform relatively well, the amount of information which can be extracted from the input signal in order to control the adaptive filtering means might be limited, especially in the case that the number of input samples is relatively low compared to the number of required output samples. By applying further input samples of a further input signal which is correlated to the input signal better filter coefficients can be determined.

It is advantageous to apply the spatial filter unit according to the invention as an interpolation filter. So, in an embodiment of the spatial filter unit according to the invention, the adaptive filtering means comprises computing means for computing the first one of the output samples on basis of interpolation of the first one of the input samples and a second one of the input samples.

Preferably, the first input signal represents a first quantity and the further input signal represents a second quantity, being different from the first quantity. The first quantity is any one of luminance, chrominance, motion, location, temperature or sound and the second quantity is another one of the list of physical variables corresponding to luminance, chrominance, motion, location, temperature or sound. E.g. for video data in a 4:2:2 (YUV) format it makes sense to use a horizontal up-scaling filter unit according to the invention, since the horizontal resolution of the luminance is higher than that of the chrominance. E.g. for video data in a 4:2:0 (YUV) format it makes sense to use a horizontal and vertical up-scaling filter unit according to the invention, since the horizontal and vertical resolution of the luminance is higher than that of the chrominance. Also for reduction of coding or transmission artifacts in a color, i.e. chrominance signal the typically superior luminance signal can be applied.

Another example is related to stereo imaging or 3D imaging. In stereo imaging, typically two sequences of images are captured of the same scene by means of two cameras. The signals corresponding to the respective images are correlated because they represent the same scene, albeit from a slightly different angle. The signal corresponding to luminance values of the first sequence of images can be applied to control the conversion of the signal corresponding to luminance values of the second sequence of images.

Alternatively, a sequence of visible images, representing luminance and optionally chrominance values is acquired and a corresponding sequence of depth images is acquired, e.g. by means of infra-red or ultra-sound. Typically the latter type of images which represent location information of objects in the scene comprise less samples than the former types of images. The signals corresponding to the visible images and the signal corresponding to the depth information are mutually correlated because they represent the same scene. The signal corresponding to luminance values can be applied to control the conversion of the signal corresponding to depth values into another signal corresponding to depth values with a higher resolution.

Another example is related to motion within a scene being imaged. There are various techniques to compute so-called motion vector fields, i.e. two-dimensional matrices comprising motion vectors for respective groups of pixels of a luminance image. See for instance the article "True-Motion Estimation with 3-D Recursive Search Block Matching" by G. de Haan et. al. in IEEE Transactions on circuits and systems for video technology, vol. 3, no. 5, October 1993, pages 368-379. In this article is described that motion vectors are estimated for blocks of 8*8 pixels. In order to convert an input signal representing a motion vector field of 8*8 blocks into an output signal representing e.g. blocks of 2*2 pixels, the signal representing the luminance values which was used to determine the motion vector field of 8*8 blocks, can be applied. Notice that many objects in the scene have shapes which do not match the block structure of the coarse motion vector field of 8*8 pixels.

Motion is often described by means of motion vectors. Another approach of describing motion is based on a so-called motion detection signal, i.e. a binary signal indication whether there is motion or not. Also for or with those type of signals the spatial filter unit according to the invention can be applied.

An embodiment of the spatial filter unit according to the invention, the coefficient-determining means comprises a predetermined Look-Up-Table for translating data which is derived from the further input signal, into the first filter coefficient, the predetermined Look-Up-Table being obtained by means of a training process. Applying a Look-Up-Table to determine filter coefficients is described above and disclosed e.g. in U.S. Pat. No. 6,323,905. A preferred technique to derive the required data from a signal, i.e. a group of samples is described above and disclosed in U.S. Pat. No. 5,444,487.

An embodiment of the spatial filter unit according to the invention comprising the Look-Up-Table is characterized in that the coefficient-determining means is arranged to determine the first filter coefficient on basis of a number of luminance values belonging to the further input signal and that the adaptive filtering means is arranged to compute the first one of the output samples on basis of a chrominance value belonging to the input signal. Hence, the chrominance signal is converted using classes derived from chrominance and luminance samples. This is advantageous because the chrominance conversion can profit from the more detailed luminance data. Consequently, the filter aperture of the adaptive filtering means and the content adaptation aperture of the coefficient-determining means differ from each other in the sense that the filter aperture acts on chrominance samples only, whereas the content aperture contains data from both luminance and chrominance signals.

In another embodiment of the spatial filter unit according to the invention, the coefficient-determining means are arranged to compute the first filter coefficient by means of an optimization algorithm. For example, the optimization algorithm is applied to evaluate an approximation of the further input sample relative to the further input sample, the approximation being based on other input samples of the further input signal in the neighborhood of the further input sample. Preferably the optimization algorithm is a Least Mean Square algorithm. An LMS algorithm is relatively simple and robust. An approach of applying an optimization algorithm for determining filter coefficients in the case of an up-conversion unit is disclosed in the cited article "Towards an overview of spatial up-conversion techniques", by Meng Zhao et al., in the proceedings of the ISCE 2002, Erfurt, Germany, 23-26 Sep. 2002.

It is advantageous to apply the spatial filter unit according to the invention as an image scaling unit. So, an embodiment of the spatial filter unit according to the invention is an image scaling unit for scaling an input image being represented by the input signal and the further input signal into an output image being represented by the output signal.

It is advantageous to apply the spatial filter unit according to the invention as a noise reduction unit. So, an embodiment of the spatial filter unit according to the invention is a noise reduction unit for converting an input image being represented by the input signal and the further input signal into an output image being represented by the output signal.

It is a further object of the invention to provide an image processing apparatus of the kind described in the opening comprising a spatial filter unit which performs better.

This object of the invention is achieved in that the coefficient-determining means are arranged to determine the first filter coefficient on basis of a further input signal being correlated to the input signal. The image processing apparatus optionally comprises a display device for displaying an output image being represented by the output signal. The image processing apparatus might e.g. be a TV, a set top box, a satellite tuner, a VCR (Video Cassette Recorder) player or a DVD (Digital Versatile Disk) player.

It is a further object of the invention to provide a method of the kind described in the opening paragraph, which performs better.

This object of the invention is achieved in determining the first filter coefficient on basis of a further input signal being correlated to the input signal.

It is a further object of the invention to provide a computer program product of the kind described in the opening paragraph, which performs better.

This object of the invention is achieved in that the computer program product, after being loaded, provides processing means with the capability to determine the first filter coefficient on basis of a further input signal being correlated to the input signal. Modifications of the spatial filter unit and variations thereof may correspond to modifications and variations thereof of the image processing apparatus, the method and the computer program product described.

Figure 1B:
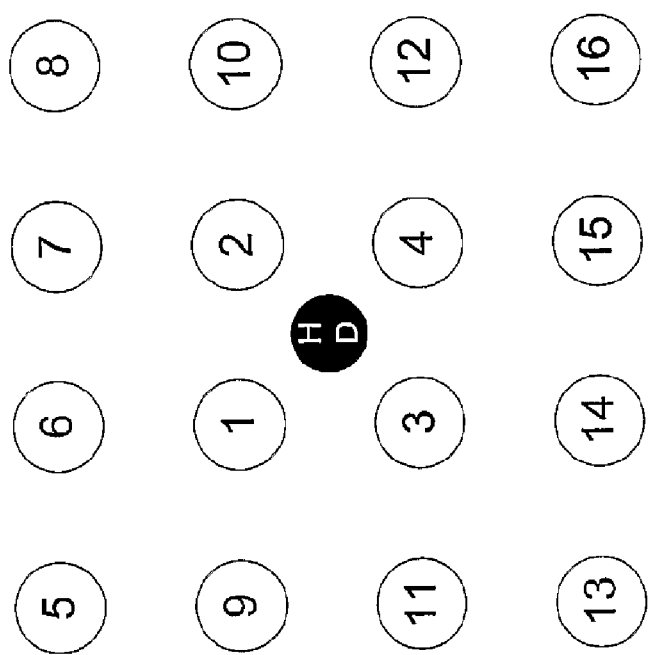
Figure 1C:
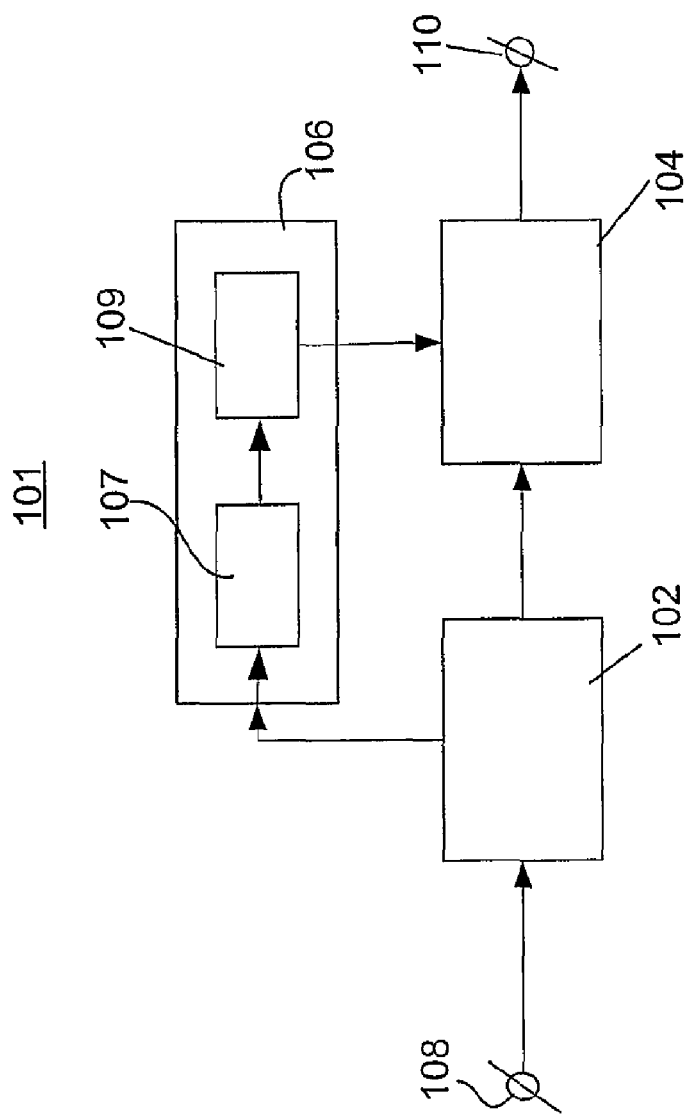
Figure 1D:
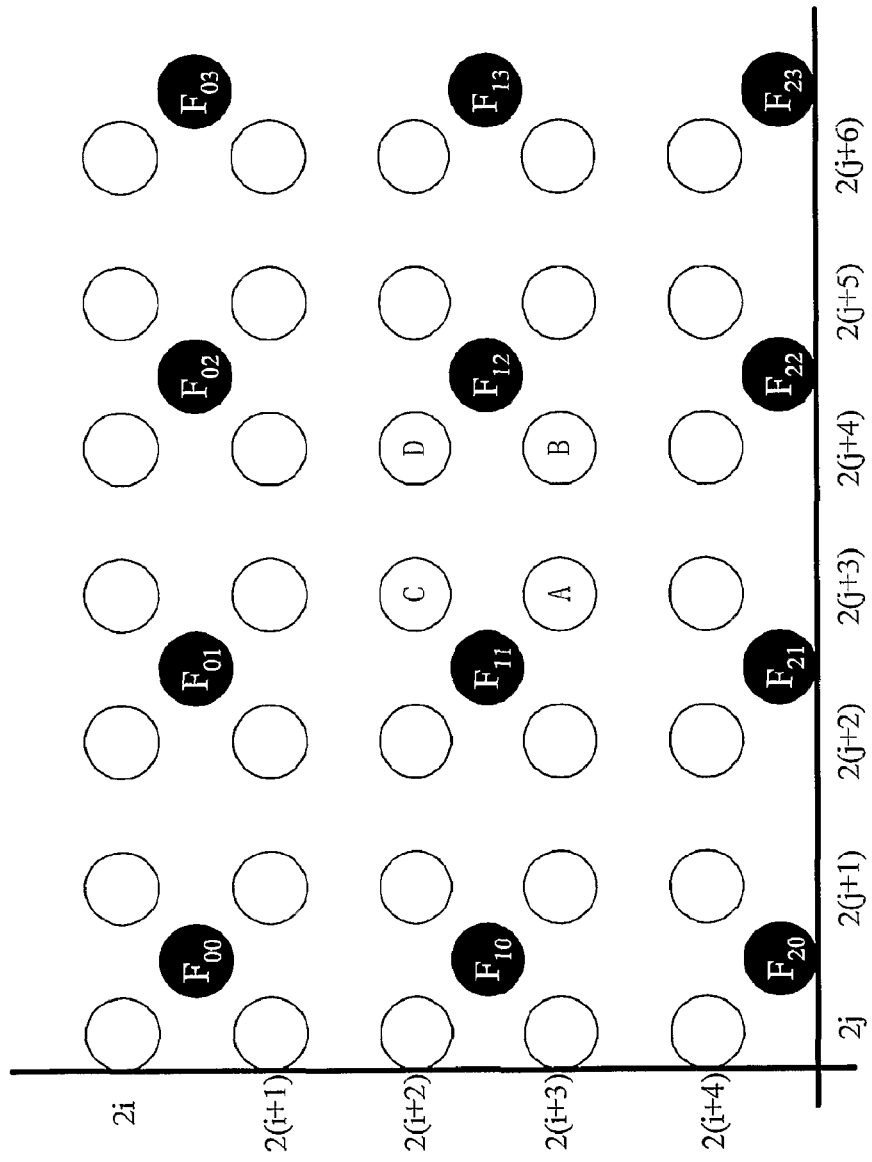
Figure 2:
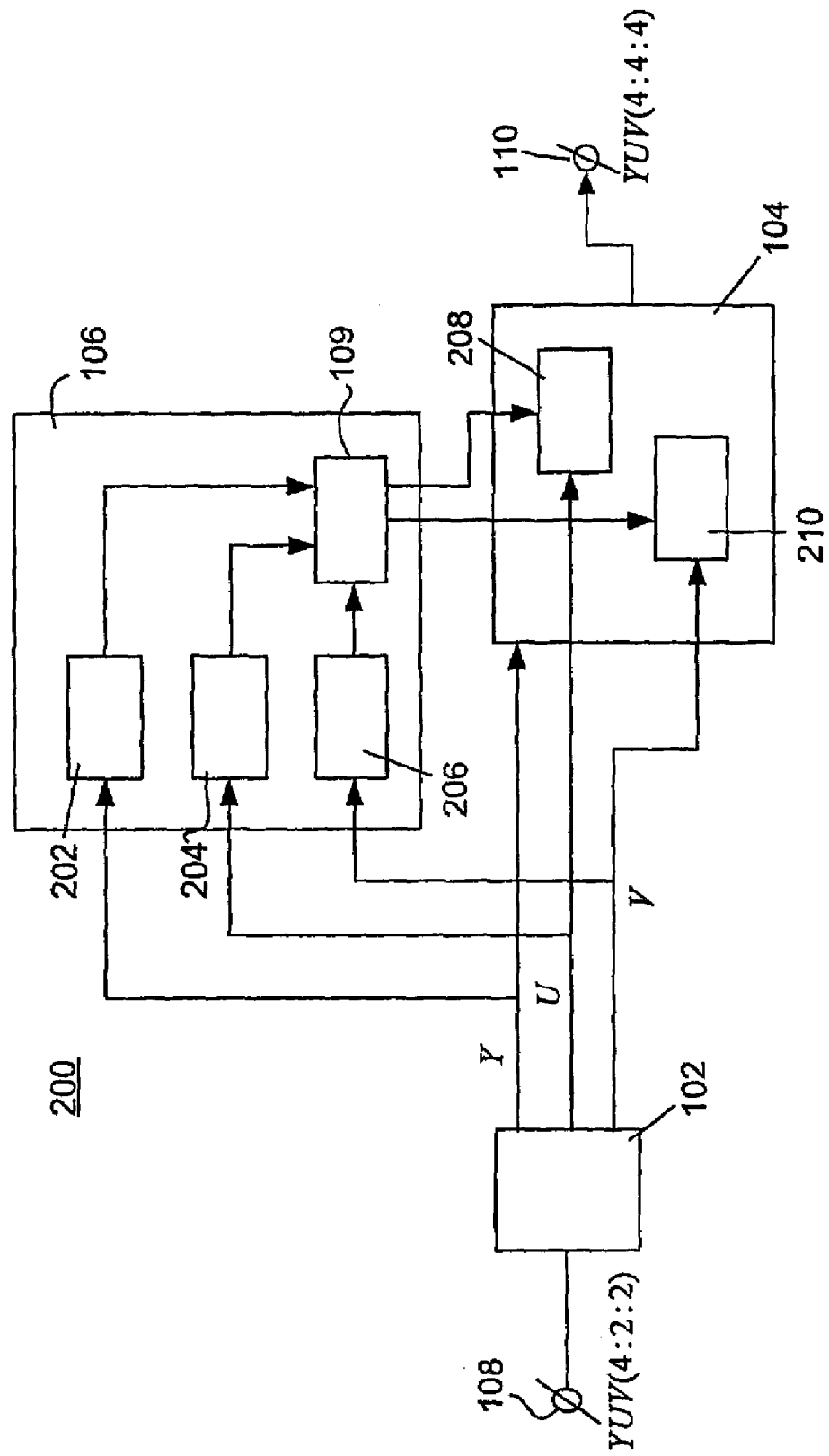
Figure 5:
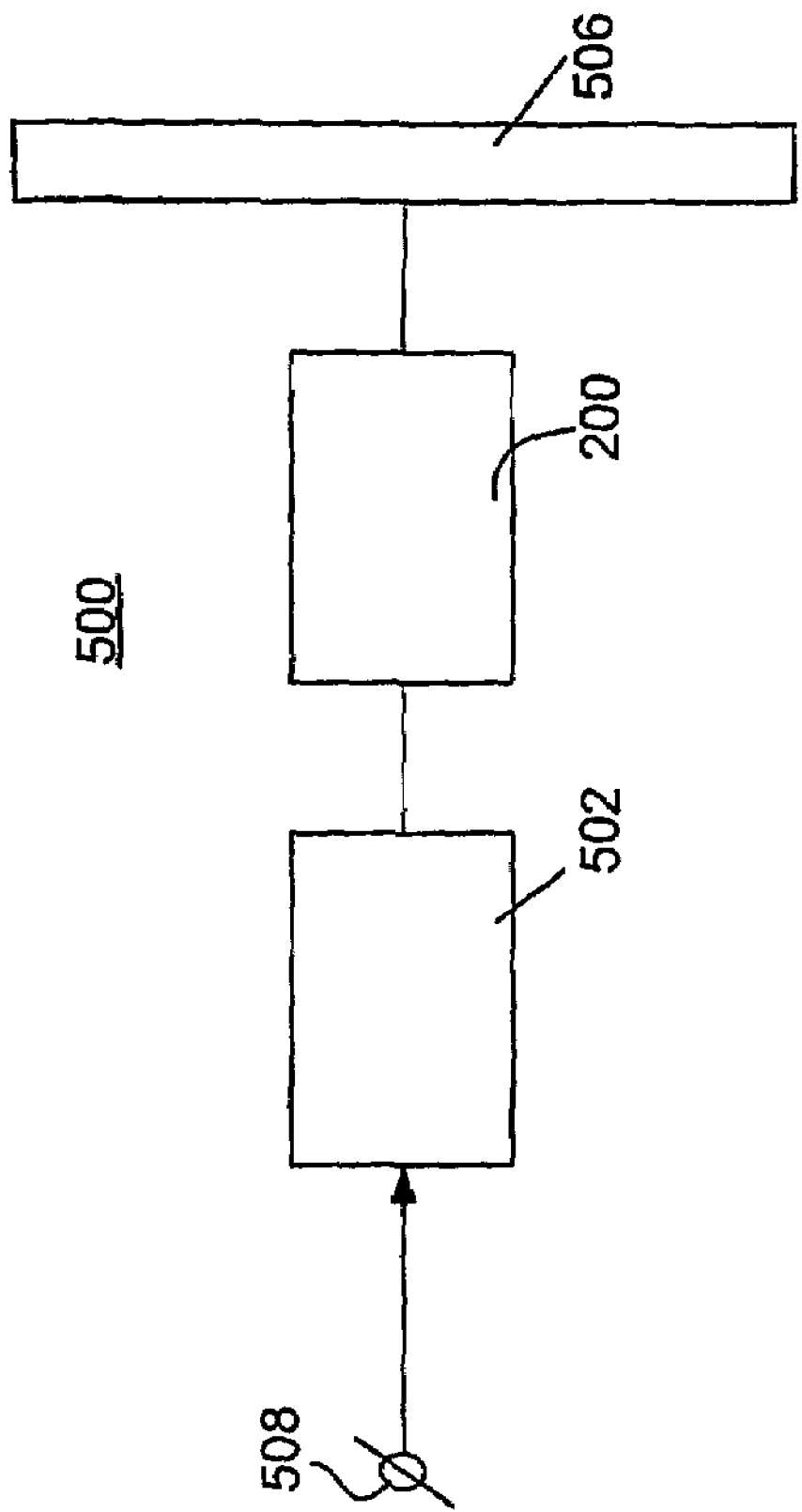

These and other aspects of the spatial filter unit, of the image processing apparatus, of the method and of the computer program product according to the invention will become apparent from and will be elucidated with respect to the implementations and embodiments described hereinafter and with reference to the accompanying drawings, wherein:

FIG. 1A schematically shows a spatial filter unit according to the prior art, being applied as image up-conversion unit;

FIG. 1B schematically shows a number of pixels to explain the up-conversion method according to the prior art;

FIG. 1C schematically shows an alternative embodiment of the spatial filter unit according to the prior art;

FIG. 1D schematically shows an aperture used in content-based interpolation according to the prior art;

FIG. 2 schematically shows an embodiment of the spatial filter unit according to the invention;

FIG. 3A schematically shows that a first input signal is applied to control the up-conversion of a second input signal into an output signal having a higher resolution than the second input signal;

FIG. 3B schematically shows an alternative example to illustrate that a first input signal is applied to control the up-conversion of a second input signal into an output signal having a higher resolution than the second input signal;

Figures 4A, 4B, 4C, 4D:
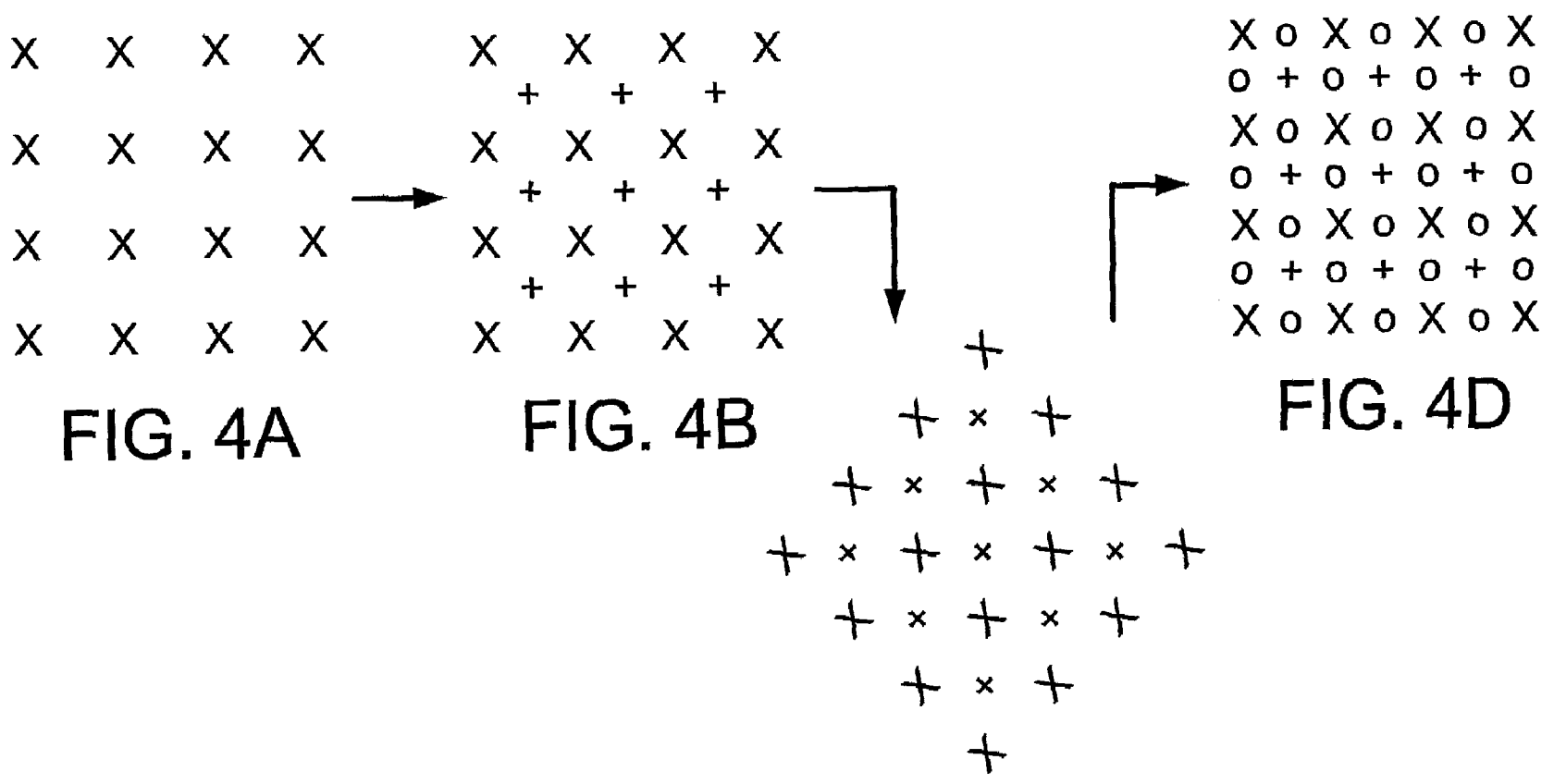

FIG. 4A schematically shows an SD input image;

FIG. 4B schematically shows the SD input image of FIG. 4A on which pixels are added in order to increase the resolution;

FIG. 4C schematically shows the image of FIG. 4B after being rotated over 45 degrees;

FIG. 4D schematically shows an HD output image derived from the SD input image of FIG. 4A; and FIG. 5 schematically shows an embodiment of the image processing apparatus according to the invention.

Same reference numerals are used to denote similar parts throughout the figs.

FIG. 1A schematically shows a spatial filter unit 100 according to the prior art, being applied as image up-conversion unit. The image conversion unit 100 is provided with standard definition (SD) images at the input connector 108 and provides high definition (HD) images at the output connector 110. The image conversion unit 100 comprises:

A pixel acquisition unit 102 which is arranged to acquire a first set of luminance values of pixels 1-4 (See FIG. 1B) in a first neighborhood of a particular location within a first one of the SD input images which corresponds with the location of an HD output pixel and is arranged to acquire a second set of luminance values of pixels 1-16 in a second neighborhood of the particular location within the first one of the SD input images;

A filter coefficient-determining unit 106, which is arranged to calculate filter coefficients on basis of the first set of luminance values and the second set of luminance values. In other words, the filter coefficients are approximated from the SD input image within a local window, more particular on basis of luminance values. This is done by using a Least Mean Squares (LMS) method which is explained in connection with FIG. 1B.

An adaptive filtering unit 104 for calculating the luminance value of the HD output pixel on basis of the first set of luminance values and the filter coefficients as specified in Equation 2. Hence, the filter coefficient-determining unit 106 is arranged to control the adaptive filtering unit 104.

The adaptive filtering unit 104 uses a fourth order interpolation algorithm as specified in Equation 2:

$$F_{HDI}(2(i+1), 2(j+1)) = \sum_{k=0}^{1} \sum_{l=0}^{1} w_e(2k+l) F_{SD}(2i+2k, 2j+2l) \quad (2)$$

where $F_{HDI}(i, j)$ denotes the luminance values of the interpolated HD output pixels, $F_{SD}(i, j)$ the luminance values of the input pixels and $w_e(i)$ the filter coefficients.

FIG. 1B schematically shows a number of pixels 1-16 of an SD input image and one HD pixel of an HD output image, to explain the up-conversion method according to the prior art. The HD output pixel is interpolated as a weighted average of 4 luminance values of pixels 1-4. That means that the luminance value of the HD output pixel $F_{HDI}$ results as a weighted sum of the luminance values of its 4 SD neighboring pixels:

$$F_{HDI} = w_e(1) F_{SD}(1) + w_e(2) F_{SD}(2) + w_e(3) F_{SD}(3) + w_e(4) F_{SD}(4), \quad (3)$$

where $F_{SD}(1)$ to $F_{SD}(4)$ are the pixel values of the 4 SD input pixels 1-4 and $w_e(1)$ to $w_e(4)$ are the filter coefficients to be calculated by means of the LMS method. The authors of the cited article "Towards an overview of spatial up-conversion techniques" in which the prior art method is described, make the sensible assumption that edge orientation does not change with scaling. The consequence of this assumption is that the optimal filter coefficients are the same as those to interpolate, on the standard resolution grid:

Pixel 1 from 5, 7, 11, and 4 (that means that pixel 1 can be derived from its 4 neighbors)
Pixel 2 from 6, 8, 3, and 12
Pixel 3 from 9, 2, 13, and 15
Pixel 4 from 1, 10, 14, and 16

This gives a set of 4 linear equations from which with the LSM-optimization the optimal 4 filter coefficients to interpolate the HD output pixel are found.

Denoting M as the pixel set, on the SD-grid, used to calculate the 4 weights, the Mean Square Error (MSE) over set M in the optimization can be written as the sum of squared differences between original SD-pixels $F_{SD}$ and interpolated SD-pixels $F_{SI}$:

$$MSE = \sum_{F_{SD}(i,j) = M} (F_{SD}(2i+2, 2j+2) - F_{SI}(2i+2, 2j+2))^2 \quad (4)$$

Which in matrix formulation becomes:

$$MSE = \| \vec{y} - \vec{w} C \|^2 \quad (5)$$

Here $\vec{y}$ contains the SD-pixels in M (pixel $F_{SD}(1,1)$ to $F_{SD}(1,4)$, $F_{SD}(2,1)$ to $F_{SD}(2,4)$, $F_{SD}(3,1)$ to $F_{SD}(3,4)$, $F_{SD}(4,1)$ to $F_{SD}(4,4)$) and C is a 4×M² matrix whose $k^{th}$ row contains the four diagonal SD-neighbors of the $k^{th}$ SD-pixels in $\vec{y}$. The weighted sum of each row describes a pixel $F_{SI}$, as used in Equation 4. To find the minimum MSE, i.e. LMS, the derivation of MSE over $\vec{w}$ is calculated:

$$\frac{\partial (MSE)}{\partial \vec{w}} = 0 \quad (6)$$

$$-2\vec{y}C + 2\vec{w}C^2 = 0 \quad (7)$$

$$\vec{w} = (C^T C)^{-1} \left( C \frac{T}{\vec{y}} \right) \quad (8)$$

By solving Equation 8 the filter coefficients are found and by using Equation 3 the luminance values of the HD output pixels can be calculated.

In this example a window of 4 by 4 pixels is used for the calculation of the filter coefficients. An LMS optimization on a larger window, e.g. 8 by 8 instead of 4 by 4 gives better results.

FIG. 1C schematically shows an alternative embodiment of the image conversion unit 101 according to the prior art. The filter coefficient-determining unit 106 comprises a compression unit 107 and a LUT 109 with data being derived during a training process. See also the description in connection with FIG. 1D for an explanation of the training process. A compression scheme is based on detecting which of the pixels in a sliding window are above and which of the pixels in the window are below the average luminance value of the pixels in the window. This results for every position of the sliding window a pattern of zeroes (pixel values below the average luminance value) and ones (pixel values above the average luminance value). This pattern corresponds with an entry of the LUT 109. At the respective output of the LUT 109 the appropriate filter coefficients are provided for the given input. In the article "Towards an overview of spatial up-conversion techniques", by Meng Zhao et al., in the Proceedings of the ISCE 2002, Erfurt, Germany, 23-26 Sep. 2002, this embodiment of the image conversion unit 101 according to the prior art is explained further.

FIG. 1D schematically shows an aperture used in content-based interpolation according to the prior art. The white pixels are interpolated HD pixels $F_{HDI}$. The black pixels are SD pixels $F_{SD}$, with $F_{12}$ a shorthand notation for $F_{SD}(1,2)$, etc. The HD pixel A that corresponds to $F_{HDI}(2(i+3),2(j+3))$, is interpolated using 12 SD pixels ($F_{00}$ up to $F_{23}$). To clarify the use of LMS in the training process, let $F_{HD}$ be the luminance value of the real (not the up-converted) HD pixel and $F_{HDI}$ be the interpolated one, which is the summed weight of the 12 SD pixels in the interpolation window. The equation used to interpolate pixels on position A is:

$$F_{HDI}(2(i+3), 2(j+3)) = \sum_{k=0}^{2} \sum_{l=0}^{3} w_{kl} F_{SD}(2(i+2k)+1, 2(j+2l)+1) \quad (9)$$

where $w_{kl}$ are weights. The square error of one class over a large number of images is:

$$e^2 = \sum_{i,j} (F_{HD}(i,j) - F_{HDI}(i,j))^2 \quad (10)$$

Suppose there are t samples for one class in the training process, $$F_{HDI,p}(2(i+3), 2(j+3)) = \quad (11)$$
$$\sum_{k=0}^{2} \sum_{l=0}^{3} w_{kl} F_{SD,p}(2(i+2k)+1, 2(j+2l)+1)$$
with $(p = 1, 2, \ldots, t)$ The error of the $p^{th}$ interpolation sample will be:

$$e_p = F_{HD,p} - F_{HI,p} = \quad (12)$$
$$F_{HD,p} - \sum_{k=0}^{2} \sum_{l=0}^{3} w_{kl} F_{SD,p}(2(i+2k)+1, 2(j+2l)+1)$$
with $(p = 1, 2, \ldots, t)$ The total error of this class is:

$$e^2 = \sum_{p=1}^{t} e_p^2 \quad (13)$$

Calculating the first derivative of $e^2$ to each w yields $$\frac{\partial e^2}{\partial w_{kl}} = \sum_{p=1}^{t} 2\left(\frac{\partial e_p}{\partial w_{kl}}\right) e_p = \sum_{p=1}^{t} 2 F_{SD,p}(2(i+2k)+1, 2(j+2l)+1) e_p \quad (14)$$
with $(k = 0, 1, 2; l = 0, 1, 2, 3)$ It is known that the extreme occurs when the first derivation is zero. Let:

$$X_{kl,qr} = \sum_{p=1}^{t} F_{SD,p}(2(i+2k)+1, 2(j+2l)+1) \cdot \quad (15)$$
$$F_{SD,p}(2(i+2q)+1, 2(j+2r)+1)$$

and:

$$Y_{4k+l} = \quad (16)$$
$$\sum_{p=1}^{t} F_{SD,p}(2(i+2k)+1, 2(j+2l)+1) \cdot F_{HD,p}(2(i+3), 2(j+3))$$

$(k, q = 0, 1, 2; l, r = 0, 1, 2, 3)$
then $$\begin{bmatrix} X_{00,00} & X_{00,01} & \ldots & X_{00,23} \\ X_{10,00} & X_{10,01} & \ldots & X_{20,23} \\ X_{20,00} & X_{20,01} & \ldots & X_{20,23} \\ \vdots & \vdots & \vdots & \vdots \\ X_{23,00} & X_{23,01} & \ldots & X_{23,23} \end{bmatrix} \begin{bmatrix} w_{00} \\ w_{01} \\ w_{02} \\ \vdots \\ w_{23} \end{bmatrix} = \begin{bmatrix} Y_0 \\ Y_1 \\ Y_2 \\ \vdots \\ Y_{11} \end{bmatrix} \quad (17)$$

By solving Equation 17 for all classes, the coefficients $w_{kl}$ are obtained. Once all the filter coefficients are known, interpolation becomes a simple calculation using Equation 9.

FIG. 2 schematically shows an embodiment of the spatial filter unit 200 according to the invention. This spatial filter unit 200 basically comprises the same type of components as the image conversion units 101 as described in connection with FIG. 1C. These components are:

- A pixel acquisition unit 102 which is arranged to acquire pixel values of the input image;
- A filter coefficient-determining unit 106 which is arranged to compute filter coefficients on basis of the acquired pixel values; and
- An adaptive filtering unit 104 for calculating the pixel values of the output pixels on basis of the acquired pixel values.

The spatial filter unit 200 is provided with video data in the YUV(4:2:2) format at the input connector 108 and provides video data in the YUV(4:4:4) format at the output connector 110.

The working of the spatial filter unit 200 according to the invention will be explained by means of an example. Suppose that the pixel acquisition unit 102 has an aperture of 12 samples. That means that the following samples are acquired together: $(Y_1,U_1,V_1)$, $(Y_2)$, $(Y_3,U_3,V_3)$, $(Y_4)$, $(Y_5,U_5,V_5)$ and $(Y_6)$. The 6 Y-samples are provided to the first compression unit 202 which converts the 6 Y-samples into a 6 bits word, as specified in Equation 18:

$$Q_Y = \begin{cases} 0 : Y_i < Y_{AV} \\ 1 : Y_i \geq Y_{AV} \end{cases} \quad (18)$$

where $Y_{AV}$ corresponds to the average luminance value in the coefficient aperture of the pixel acquisition unit 102. The 3 U-samples are provided to the second compression unit 204 which converts the 3 U-samples into a 3 bits word, as specified in Equation 19:

$$Q_U = \begin{cases} 0 : U_i < U_{AV} \\ 1 : U_i \geq U_{AV} \end{cases} \quad (19)$$

where $U_{AV}$ corresponds to a first average chrominance value in the coefficient aperture of the pixel acquisition unit 102. The 3 V-samples are provided to the third compression unit 206 which converts the 3 V-samples into a 3 bits word, as specified in Equation 20:

$$Q_V = \begin{cases} 0 : V_i < V_{AV} \\ 1 : V_i \geq V_{AV} \end{cases} \quad (20)$$

where $V_{AV}$ corresponds to a second average chrominance value in the coefficient aperture of the pixel acquisition unit 102. Subsequently the individual Q-values of all samples of the three components (YUV) are concatenated to form a single class-index of 12 bits.

On basis of the 12 bits word, filter-coefficients are derived from the LUT 109 which comprises transformation information being derived during a training process. In this case the LUT 109 provide triples of filter coefficients for the computation of the missing U-samples, e.g. three filter coefficients for the computation of $U_2$ on basis of $U_1$, $U_3$ and $U_5$, and another three filter coefficients for the computation of $U_4$ on basis of $U_1$, $U_3$ and $U_5$. In this case the LUT 109 also provide triples of filter coefficients for the computation of the missing V-samples, e.g. three filter coefficients for the computation of $V_2$ on basis of $V_1$, $V_3$ and $V_5$, and another three filter coefficients for the computation of $V_4$ on basis of $V_1$, $V_3$ and $V_5$. Finally the output comprises the following samples: $(Y_1,U_1,V_1)$, $(Y_2,U_2,V_2)$, $(Y_3,U_3,V_3)$, $(Y_4,U_4,V_4)$, $(Y_5,U_5,V_5)$ and $(Y_6,U_6,V_6)$.

The proposed aperture of the filter depends on the video format. For a YUV(4:2:2) format it makes sense to use a horizontal up-scaling filter according to the invention, since the horizontal resolution of the luminance is higher than that of the chrominance. For video data in YUV(4:2:0) format a two dimensional aperture seems appropriate as also the vertical luminance resolution is higher than that of the chrominance.

In the example above a SD input image in the YUV(4:2:2) format is converted to an SD output image in the YUV(4:4:4) format. Optionally, the SD output image in the YUV(4:4:4) format is subsequently up-converted to an HD output image in the YUV(4:4:4) format. Alternatively, a SD input image in the YUV(4:2:2) format is directly up-converted to an HD output image in the YUV(4:4:4) format. In that case the luminance signal can be used to control the up-conversion of the chrominance and vice versa.

The pixel acquisition unit 102, the filter coefficient-determining unit 106 and the adaptive filtering unit 104 may be implemented using one processor. Normally, these functions are performed under control of a software program product. During execution, normally the software program product is loaded into a memory, like a RAM, and executed from there. The program may be loaded from a background memory, like a computer-readable storage medium including ROM, hard disk, or magnetically and/or optical storage, or may be loaded via a network like Internet. Optionally an application specific integrated circuit provides the disclosed functionality.

Above it is shown that the different Q-values are computed separately and subsequently concatenated. In other words the Q-values are computed independently for the luminance and chrominance values. This has an attractive side-effect. In the U.S. Pat. No. 6,019,216, it was shown that for the luminance up-scaling, by inverting the picture data, the coefficients in the LUT remain the same. It is reasonable to assume that any binary class and its inverted version yield the same interpolation coefficients. Consequently, two complementary classes can be combined, which reduces the size of the LUT with a factor of two without any loss of quality of the output signal. It seems reasonable that this holds equally well for the chrominance data U and V. By coding the three components (Y/U/V) independently, the number of Q's for each component is reduced with a factor two, i.e. 3-bits are saved, or a factor of 8 in the address-space of the LUT.

Typically, the training process for up-conversion comprises the following steps, down sampling original signal and finding optimal filter coefficients in order to convert the down-sampled signal into a signal which matches the original signal. A similar approach is taken for the training process for e.g. noise reduction: adding noise to an original signal and finding optimal filter coefficients in order to convert the noisy signal into a signal which matches the original signal. It will be clear that in the training process signals are required which correspond to both types of input signals which are applied in the spatial filter unit 200 according to the invention during conversion of the first input signal into the output signal, e.g. both luminance and chrominance data. This is different with adaptive filtering means according to the prior art as described in connection with FIGS. 1C and 1D. In the latter case only one type of signal is analyzed during the training process and the signal conversion.

FIG. 3A schematically shows that a first input signal 302 is applied to control the up-conversion of a second input signal 306 into an output signal 316 having a higher resolution than the second input signal 306. Although both input signals and the output signal are two-dimensional signals, from the first input signal 302 only one of the two dimensions in depicted. That means that a one-dimensional representation is given. The first input signal 302 comprises a first part 330 with relatively high values, a steep transition 332 and a second part 334 with relatively low values. From the second input signal. 306 only 4 samples 308-314 are depicted which have the values L1, L1, L2 and L2 respectively. From the output signal 316 only 16 samples 318-328 are depicted. Four of these 16 samples 318-324 have been assigned the value L1 and the other 12 samples 326-328 have been assigned the value L2. It can be clearly seen that the 4 samples 318-324 which have been assigned the value L1 correspond to the first part 330 of the first input signal 302 with relatively high values. The values of the samples 318-328 of the output signal 316 have been computed on basis of the values 308-314 of the second input signal 306 and under control of the first input signal 302. That means that the filter coefficients for the computation of the output samples 318-328 are based on the values of the samples of the correlated first input signal 302. E.g. a first one of the output samples 318 of the output signal 316 is computed by means of a weighted average of two of the input samples 308, 310 of the second input signal. In this case the first weighting factor, i.e. the first filter coefficient, for one 308 of these two input samples is relatively high while the second weighting factor, i.e. the second filter coefficient, for the other one 310 of these two input samples is relatively low. As a result the first one of the output samples 318 has been assigned the value L1 being the value of one 308 of the two input samples.

FIG. 3B schematically shows an alternative example to illustrate that a first input signal 304 is applied to control the up-conversion of a second input signal 306 into an output signal 316 having a higher resolution than the second input signal 306. The first input signal 304 comprises a first part 336 with relatively high values, a slow transition 338 and a second part 340 with relatively low values. From the second input signal 306 only 4 input samples 308-314 are depicted which have the values L1, L1, L2 and L2 respectively. From the output signal 316 only 16 output samples 318-328 are depicted. Four of these 16 output samples 318-324 have been assigned the value L1, another 4 output samples have been assigned the value L3, another 4 output samples have been assigned the value L4 and another 4 output samples 326-328 have been assigned the value L2. It can be clearly seen that the 4 output samples 318-324 which have been assigned the value L1 correspond to the first part 336 of the first input signal 304 with relatively high values and that the 4 output samples 326-328 which have been assigned the value L2 correspond to the second part 340 of the first input signal 304 with relatively low values. The other output samples which have been assigned the values L3 or L4 correspond to the transition 338. The values of the output samples 318-328 of the output signal 316 have been computed on basis of the values 308-314 of the second input signal 306 and under control of the first input signal 304. That means that the filter coefficients for the computation of the output samples 318-328 are based on the values of the samples of the correlated first input signal 304.

To convert an SD input image into an HD output image a number of processing steps are needed. By means of FIGS. 4A-3D these processing steps are explained. FIG. 4A sche-matically shows an SD input image; FIG. 4D schematically shows an HD output image derived from the SD input image of FIG. 4A and FIGS. 4B and 4C schematically show intermediate results.

FIG. 4A schematically shows an SD input image. Each X-sign correspond with a respective pixel.

FIG. 4B schematically shows the SD input image of FIG. 4A on which pixels are added in order to increase the resolution. The added pixels are indicated with +-signs. These added pixels are calculated by means of interpolation of the respective diagonal neighbors.

FIG. 4C schematically shows the image of FIG. 4B after being rotated over 45 degrees. The same image conversion unit 200 as being applied to calculate the image as depicted in FIG. 4B on basis of FIG. 4A can be used to calculate the image as shown in FIG. 4D on basis of the image as depicted in FIG. 4B. That means that new pixel values are calculated by means of interpolation of the respective diagonal neighbors. Notice that a first portion of these diagonal neighbors (indicated with X-signs) correspond to the original pixel values of the SD input image and that a second portion of these diagonal neighbors (indicated with +-signs) correspond to pixel values which have been derived from the original pixel values of the SD input image by means of interpolation.

FIG. 4D schematically shows the final HD output image. The pixels that have been added in the last conversion step are indicated with o-signs.

FIG. 5 schematically shows an embodiment of the image processing apparatus 500 according to the invention, comprising:

receiving means 502 for receiving a signal representing video data in the YUV(4:2:2) format;

the spatial filter unit 200 as described in connection with FIG. 2; and a display device 506 for displaying the video data in the YUV(4:4:4) format of the spatial filter unit 200. This display device 506 is optional.

The signal may be a broadcast signal received via an antenna or cable but may also be a signal from a storage device like a VCR (Video Cassette Recorder) or Digital Versatile Disk (DVD). The signal is provided at the input connector 508. The image processing apparatus 500 might e.g. be a TV. Alternatively the image processing apparatus 500 does not comprise the optional display device but provides output images to an apparatus that does comprise a display device 506. Then the image processing apparatus 500 might be e.g. a set top box, a satellite-tuner, a VCR player or a DVD player. But it might also be a system being applied by a film-studio or broadcaster.

It should be noted that the above-mentioned embodiments illustrate rather than limit the invention and that those skilled in the art will be able to design alternative embodiments without departing from the scope of the appended claims. In the claims, any reference signs placed between parentheses shall not be constructed as limiting the claim. The word 'comprising' does not exclude the presence of samples or steps not listed in a claim. The word "a" or "an" preceding an sample does not exclude the presence of a plurality of such samples. The invention can be implemented by means of hardware comprising several distinct samples and by means of a suitable programmed computer. In the unit claims enumerating several means, several of these means can be embodied by one and the same item of hardware.

The invention claimed is:

1. A spatial filter unit for converting an input signal comprising input samples, into an output signal comprising output samples, the spatial filter unit comprising:
   coefficient-determining means for determining a first filter coefficient; and
   adaptive filtering means for computing a first one of the output samples on basis of a first one of the input samples and the first filter coefficient,
characterized in that the coefficient-determining means determines the first filter coefficient on basis of a further input signal, said further input signal being correlated to the input signal, wherein said first input signal is a first signal type and the further input signal is a second signal type, said second signal type being different from said first signal type.

2. The spatial filter unit as claimed in claim 1, characterized in that the coefficient-determining means further determines the first filter coefficient on basis of both the input signal and the further input signal.

3. The spatial filter unit as claimed in claim 1, characterized in that the adaptive filtering means comprises computing means for computing a first one of the output samples on basis of interpolation of a first one of the input samples and a second one of the input samples.

4. The spatial filter unit as claimed in claim 1, characterized in that the first signal type is any one of luminance, chrominance, motion, location, temperature or sound.

5. The spatial filter unit as claimed in claim 4, characterized in that the second signal type is any one of luminance, chrominance, motion, location, temperature or sound.

6. The spatial filter unit as claimed in claim 1, characterized in that the coefficient-determining means comprises a predetermined Look-Up-Table for translating data which is derived from the further input signal, into the first filter coefficient, the predetermined Look-Up-Table containing filter coefficients obtained by a training process.

7. The spatial filter unit as claimed in claim 6, characterized in that the coefficient-determining means determines the first filter coefficient on basis of a number of luminance values belonging to the further input signal, and that the adaptive filtering means computes a first one of the output samples on basis of a chrominance value belonging to the input signal.

8. The spatial filter unit as claimed in claim 1, characterized in that the coefficient-determining means computes the first filter coefficient by means of an optimization algorithm.

9. The spatial filter unit as claimed in claim 1, characterized in that said spatial filter unit is an image scaling unit for scaling an input image, being represented by the input signal, and the further input signal into an output image being represented by the output signal.

10. The spatial filter unit as claimed in claim 1, characterized in that said spatial filter unit is a noise reduction unit for converting an input image, being represented by the input signal, and the further input signal into an output image being represented by the output signal.

11. An image processing apparatus comprising:
    receiving means for receiving an input signal and a further input signal; and
    the spatial filter unit as claimed in claim 1 for converting the input signal into an output signal.

12. The image processing apparatus as claimed in claim 11, characterized in that said image processing apparatus further comprises a display device for displaying an output image being represented by the output signal.

13. The image processing apparatus as claimed in claim 12, characterized in that said image processing apparatus is a TV.

14. A method of converting an input signal comprising input samples, into an output signal comprising output samples, the method comprising:
    determining, using coefficient-determining means, a first filter coefficient; and
    computing, using adaptive filtering unit, a first one of the output samples on basis of a first one of the input samples and the first filter coefficient,
characterized in that said step of determining the first filter coefficient is performed on the basis of a further input signal, said further input signal being correlated to the input signal, wherein said first input signal is a first signal type and the further input signal is a second signal type, said second signal type being different from said first signal type.

15. A computer-readable storage medium having stored thereon a computer program product to be loaded into a computer arrangement, said computer program product comprising instructions for causing the computer arrangement to convert an input signal comprising input samples, into an output signal comprising output samples, the computer arrangement comprising processing means and a memory, the computer program product, after being loaded, providing said processing means with the capability to carry out:
    determining a first filter coefficient; and
    computing a first one of the output samples on basis of a first one of the input samples and the first filter coefficient,
characterized in that the determining of the first filter coefficient is on the basis of a further input signal, said further input signal being correlated to the input signal, wherein said first input signal is a first signal type and the further input signal is a second signal type, said second signal type being different from said first signal type.

* * * * *